(12) United States Patent
Oliver et al.

(10) Patent No.: US 11,379,749 B2
(45) Date of Patent: Jul. 5, 2022

(54) IDENTIFYING NOISE SOURCES IN QUANTUM SYSTEMS VIA MULTI-LEVEL NOISE SPECTROSCOPY

(71) Applicant: Massachusetts Institute of Technology, Cambridge, MA (US)

(72) Inventors: William D. Oliver, Arlington, MA (US); Youngku Sung, Cambridge, MA (US); Antti Pekka Vepsalainen, Malden, MA (US); Jochen Braumueller, Somerville, MA (US); Simon Gustavsson, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 366 days.

(21) Appl. No.: 16/809,659

(22) Filed: Mar. 5, 2020

(65) Prior Publication Data
US 2021/0279624 A1    Sep. 9, 2021

(51) Int. Cl.
*G06N 10/00*    (2022.01)

(52) U.S. Cl.
CPC ................. *G06N 10/00* (2019.01)

(58) Field of Classification Search
CPC ......... G06N 10/00; G06N 10/40; B82Y 10/00
See application file for complete search history.

(56) References Cited

U.S. PATENT DOCUMENTS

| | | | |
|---|---|---|---|
| 2006/0179089 A1* | 8/2006 | Moriya | G06F 17/18 708/200 |
| 2010/0008574 A1* | 1/2010 | Ishiga | H04N 9/69 382/167 |
| 2021/0311442 A1* | 10/2021 | Biercuk | G06N 10/80 |
| 2022/0058022 A1* | 2/2022 | Fiske | G06N 10/00 |

OTHER PUBLICATIONS

Almog, et al., "Direct Measurement of the System-Environment Coupling as a Tool for Understanding Decoherence and Dynamical Decoupling;" Journal of Physics B: Atomic, Molecular, and Optical Physics, vol. 44; Mar. 6, 2011; 10 Pages.
Alvarez, et al., "Measuring the Spectrum of Colored Noise by Dynamical Decoupling;" Physical Review Letters, vol. 107; Nov. 30, 2011; 5 Pages.
(Continued)

*Primary Examiner* — Jany Richardson
(74) *Attorney, Agent, or Firm* — Daly, Crowley, Mofford & Durkee, LLP

(57) ABSTRACT

According to some embodiments, a method can identify and discriminate contributions from one or more noise sources using the multi-level structure of a quantum system with three or more levels. The method can include: preparing the quantum system in a predetermined state; applying one or more control signals to the quantum system; measuring values of one or more observables of the quantum system that quantify the quantum system's response to the noise sources and the one or more applied control signals; extracting noise spectra information associated with the noise sources from the measured values; and identifying contributions from the one or more noise sources based on the noise spectra information.

11 Claims, 5 Drawing Sheets

(56) References Cited

OTHER PUBLICATIONS

Arute, et al., "Quantum Supremacy Using a Programmable Superconducting Processor;" Nature, vol. 574; Oct. 24, 2019; 7 Pages.
Bar-Gill, et al., "Suppression of Spin-Bath Dynamics for Improved Coherence of Multi-Spin-Qubit Systems;" Nature Communications; May 22, 2012; 6 Pages.
Barends, et al., "Coherent Josephson Qubit Suitable for Scalable Quantum Integrated Circuits;" Physical Review Letters, vol. 111; Aug. 22, 2013; 5 Pages.
Baur, et al., "Measurement of Autler-Townes and Mollow Transitions in a Strongly Driven Superconducting Qubit;" Physical Review Letters, vol. 102; Jun. 19, 2009; 4 Pages.
Biercuk, et al., "Dynamical Decoupling Sequence Construction as a Filter-Design Problem;" Journal of Physics B: Atomic, Molecular and Optical Physics, vol. 44; Apr. 23, 2011; 16 Pages.
Bishop, et al., "Nonlinear Response of the Vacuum Rabi Resonance;" Nature Physics, vol. 5; Dec. 14, 2008; 5 Pages.
Bylander, et al., "Noise Spectroscopy through Dynamical Decoupling with a Superconducting Flux Qubit;" Nature Physics, vol. 7; May 8, 2011; 6 Pages.
Braumuller, et al., "Multiphoton Dressing of an Anharmonic Superconducting Many Level Quantum Circuit;" Physical Review B, vol. 91; Feb. 26, 2015; 9 Pages.
Chan, et al., "Assessment of a Silicon Quantum Dot Spin Environment via Noise Spectroscopy;" Physical Review Applied, vol. 10; Oct. 5, 2018; 7 Pages.
Christensen, et al., "Anomalous Charge Noise in Superconducting Qubits;" Physical Review B, vol. 100; Oct. 24, 2019; 6 Pages.
Degen, et al., "Quantum Sensing;" Reviews of Modern Physics, vol. 89; Jul.-Sep. 2017; 39 Pages.
Dial, et al., "Charge Noise Spectroscopy Using Coherent Exchange Oscillations in a Single-Triplet Qubit;" Physical Review Letters, vol. 110; Apr. 5, 2013; 5 Pages.
Faoro, et al., "Dynamical Suppression of /f Noise Processes in Qubit Systems;" Physical Review Letters, vol. 92, No. 11; Mar. 18, 2004; 4 Pages.
Frey, et al., "Application of Optimal Band-Limited Control Protocols to Quantum Noise Sensing;" Nature Communications; Dec. 19, 2017; 8 Pages.
Gambetta, et al., "Analytic Control Methods for High-Fidelity Unitary Operations in a Weakly Nonlinear Oscillator;" Physical Review A, vol. 83; Jan. 18, 2011; 13 Pages.
Jeffrey, et al., "Fast Accurate State Measurement with Superconducting Qubits;" Physical Review Letters, vol. 112; May 15, 2014; 5 Pages.
Koch, et al., "Charge-Insensitive Qubit Design Derived from the Cooper Pair Box;" Physical Review A, vol. 76; Oct. 12, 2007; 19 Pages.
Kotler, et al., "Nonlinear Single-Spin Spectrum Analyzer;" Physical Review Letters, vol. 110; Mar. 14, 2013; 5 Pages.
Kotler, et al., "Single-Ion Quantum Lock-In Amplifier;" Nature, vol. 473; May 5, 2011; 5 Pages.
Larsen, et al., "Semiconductor-Nanowire-Based Superconducting Qubit;" Physical Review Letters, vol. 115; Sep. 14, 2015; 5 Pages.
Lupke, et al., "Two-Qubit Spectroscopy of Spatiotemporally Correlated Quantum Noise in Superconducting Qubits;" Retrieved from https://arxiv.org/abs/1912.04982; Dec. 10, 2019; 22 Pages.
Macklin, et al., "A Near Quantum-Limited Joesephson Traveling-Wave Parametric Amplifier;" Science Magazine, vol. 350, Issue 6258; Oct. 16, 2015; 5 Pages.
Majer, et al., "Coupling Superconducting Qubits via a Cavity Bus;" Nature, vol. 449; Sep. 27, 2007; 5 Pages.
Meriles, et al., "Imaging Mesoscopic Nuclear Spin Noise with a Diamond Magnetometer;" The Journal of Chemical Physics, vol. 133; Sep. 27, 2010; 9 Pages.
Muhonen, et al., "Storing Quantum Information for 30 Seconds in a Nanoelectronic Device;" Nature Nanotechnology, vol. 9; Oct. 12, 2014; 6 Pages.
Norris, et al., "Qubit Noise Spectroscopy for Non-Gaussian Dephasing Environments;" Physical Review Letters, vol. 116; Apr. 14, 2016; 5 Pages.
Oliver, et al., "Materials in Superconducting Quantum Bits;" Cambridge University Press; Oct. 14, 2013; 10 Pages.
Paladino, et al., "1/ noise: Implications for Solid-State Quantum Information;" Review of Modern Physics, vol. 86, Dec. 17, 2013; 63 Pages.
Peterer, et al., "Coherence and Decay of Higher Energy Levels of a Superconducting Transmon Qubit;" Physical Review Letters, vol. 114; Jan. 6, 2015; 5 Pages.
Preskill, "Quantum Computing in the NISQ Era and Beyond;" Quantum 2, vol. 79; Retrieved from https://arxiv.org/abs/1801.00862; Jul. 30, 2018; 20 Pages.
Quintana, et al., "Observation of Classical-Quantum Crossover of 1/ Flux Noise and Its Paramagnetic Temperature Dependence;" Physical Review Letters, vol. 118; Jan. 31, 2017; 6 Pages.
Romach, et al., "Spectroscopy of Surface-Induced Noise Using Shallow Spins in Diamond;" Physical Review Letters, vol. 114; Jan. 6, 2015; 5 Pages.
Schoelkope, et al., "Qubits as Spectrometers of Quantum Noise;" Retrieved from https://arxiv.org/abs/cond-mat/0210247; Oct. 10, 2002; 31 Pages.
Sete, et al., "Quantum Theory of a Bandpass Purcell Filter for Qubit Readout;" Physical Review A, vol. 92; Jul. 21, 2015; 13 Pages.
Sung, et al., "Non-Gaussian Noise Spectroscopy with a Superconducting Qubit Sensor;" Nature Communications; Sep. 16, 2019; 8 Pages.
Vandersypen, et al., "NMR Techniques for Quantum Control and Computation;" Retrieved from https://arxiv.org/abs/quant-ph/0404064; Jun. 10, 2004; 33 Pages.
Wang, et al., "Coherent Control of a Hybrid Superconducting Circuit Made with Graphene-Based van der Waals Heterostructures ;" Nature Nanotechnology, vol. 14; Feb. 2019; 7 Pages.
Yan, et al., "Rotating-Frame Relaxation as a Noise Spectrum Analyser of a Superconducting Qubit Undergoing Driven Evolution;" Nature Communications; Aug. 15, 2013; 8 Pages.
Yan, et al., "Spectroscopy of Low-Frequency Noise and Its Temperature Dependence in a Superconducting Qubit;" Physical Review B, vol. 85; May 22, 2012; 10 Pages.
Yan, et al., "The Flux Qubit Revisited to Enhance Coherence and Reproducibility;" Nature Communications; Nov. 3, 2016; 9 Pages.
Yan, et al., "Distinguishing Coherent and Thermal Photon Noise in a Circuit Quantum Electrodynamical System;" Physical Review Letters, vol. 120; Jun. 29, 2018; 6 Pages.
Yoneda, et al., "A Quantum-Dot Spin Qubit with Coherence Limited by Charge Noise and Fidelity Higher than 99.9%;" Nature Nanotechnology, vol. 13, Feb. 2018; 6 Pages.
Yoshihara, et al., "Flux Qubit Noise Spectroscopy Using Rabi Oscillations Under Strong Driving Conditions;" Physical Review B, vol. 89; Jan. 9, 2014; 5 Pages.
Young, et al., "Qubits as Spectrometers of Dephasing Noise;" Physical Review A, vol. 86; Jul. 13, 2012; 7 Pages.

* cited by examiner

IDENTIFYING NOISE SOURCES IN QUANTUM SYSTEMS VIA MULTI-LEVEL NOISE SPECTROSCOPY

STATEMENT REGARDING FEDERALLY SPONSORED RESEARCH

This invention was made with Government support under Grant No. W911NF-14-1-0682 awarded by the Army Research Office (ARO). The Government has certain rights in the invention.

BACKGROUND

System noise identification is crucial to the engineering of robust quantum systems, relevant in quantum information processing and quantum sensing. Since noise in quantum devices places serious limitations on what quantum devices can achieve in the near term, identifying dominant sources of noise and eliminating them is crucial for improving future quantum devices.

Quantum noise spectroscopy (QNS) protocols have been developed and implemented to characterize noise processes in quantum systems. Existing approaches aim to characterize the spectral properties of environmental noise using a qubit as a spectrometer. A qubit spectrometer can be approximated as a two-level system, if higher levels of a qubit are not affected while coupling the two fundamental qubit levels to an electromagnetic field. By driving the qubit with suitably tailored external microwave control fields and measuring its response in the presence of environmental noise, the spectral content of the noise can be extracted. QNS protocols have been explored for both pulsed (free-evolution) and continuous (driven-evolution) control schemes and experimentally implemented across many qubit platforms—including nitrogen vacancy centers in diamond, nuclear spins, semiconductor quantum dots, trapped ions, and superconducting quantum circuits.

Although existing quantum noise spectroscopy (QNS) protocols measure an aggregate amount of noise affecting a quantum system, they generally cannot distinguish between the underlying processes that contribute to it.

Among existing QNS protocols, the spin-locking approach has been shown to be applicable to both classical and non-classical noise spectra. It uses a relatively straightforward relaxometry analysis to extract the spectral decomposition of the environmental noise affecting single qubits, and it has recently been extended to measure the cross-spectra of spatially correlated noise in multi-qubit systems. However, despite its efficacy, like most QNS protocols today, it was used and experimentally demonstrated only in the two-level approximation.

SUMMARY

Disclosed herein is a QNS protocol based on the spin-locking technique that is applicable to multi-level systems and allows for extracting the noise contributions from various noise sources, along with embodiments of systems and methods using the QNS protocol. Disclosed embodiments have been experimentally demonstrated using a flux-tunable transmon qubit, acting as a multi-level noise sensor.

It is appreciated herein that existing QNS protocols developed within a two-level system approximation have certain limitations (for example, limited bandwidth) when applied to weakly anharmonic qubits such as the transmon, the gatemon, or the capacitively shunted flux qubit, which are among the most promising candidates for realizing scalable quantum information processors. Since the presently disclosed noise spectroscopy technique incorporates the effects of higher-excited states, it is readily applicable in these weakly anharmonic superconducting qubits and is therefore compatible with state-of-the-art superconducting circuit implementations.

According to one aspect of the present disclosure, a method for identifying and discriminating contributions from one or more noise sources using the multi-level structure of a quantum system with three or more levels can include: preparing the quantum system in a predetermined state; applying one or more control signals to the quantum system; measuring values of one or more observables of the quantum system that quantify the quantum system's response to the noise sources and the one or more applied control signals; extracting noise spectra information associated with the noise sources from the measured values; and identifying contributions from the one or more noise sources based on the noise spectra information.

In some embodiments, the method can include improving performance of the quantum system based on the extracted noise spectra information and the identified contributions from the one or more noise sources. In some embodiments, the quantum system may include a plurality of superconducting qubits. In some embodiments, the superconducting qubits can include transmon or gatemon qubits. In some embodiments, the quantum system can include at least one of: a nuclear spin system, an electron spin system, a trapped-ion system, a neutral-atom system, or a superconducting circuit. In some embodiments, the one or more noise sources include at least two of: flux noise, charge noise, and photon shot noise.

According to one aspect of the present disclosure, a system may be provided for identifying and discriminating contributions from one or more noise sources using the multi-level structure of a quantum system with three or more levels. The system can include a signal generator and a noise identification processor. The signal generator may be configured to: prepare the quantum system in a predetermined state and apply one or more control signals to the quantum system. The noise identification processor may be configured to: measure values of one or more observables of the quantum system that quantify the quantum system's response to the noise sources and the one or more applied control signals; extract noise spectra information associated with the noise sources from the measured values; and identify contributions from the one or more noise sources based on the noise spectra information.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Disclosed herein is a spin-locking-based quantum noise spectroscopy (QNS) protocol that exploits the multi-level energy structure of a superconducting qubit, along with various embodiments of systems and methods that utilize the protocol. Disclosed embodiments can extend the spectral range of weakly anharmonic qubit spectrometers beyond the present limitations set by their lack of strong anharmonicity (e.g., it expands the spectral range of a qubit spectrometer beyond the two-level approximation). In addition, using additional information gained from probing the higher-excited levels, disclosed embodiments can identify and distinguish contributions from different underlying noise mechanisms. That is, embodiments of the present disclosure allow for extracting the noise contributions from various noise sources, since the matrix elements for higher qubit transitions typically scale differently with level number depending on the origin of the noise.

Figure 1:
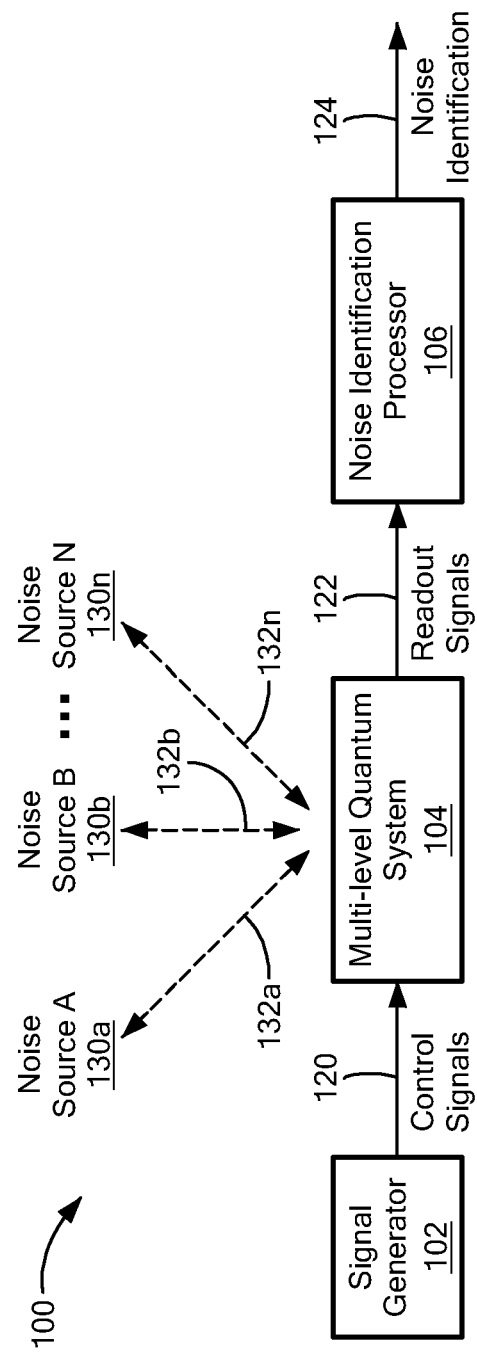
FIG. 1 is a block diagram of an illustrative noise identification system, which uses a multi-level quantum system as a noise sensor, according to disclosed embodiments.

FIG. 1 shows a noise identification system 100 in which noise contributions from various noise sources can be identified using multi-level noise spectroscopy, according to disclosed embodiments. The illustrative system 100 can include a signal generator 102, a multi-level quantum system 104, and a noise identification processor 106.

Signal generator 102 can generate control signals 120 for the multi-level quantum system 104. Control signals 120 can be, for example, pulsed sequences or continuous drive signals. Examples of control signal waveforms are shown and described in the context of FIGS. 2B and 2C. Signal generator 102 can include a collection of hardware and/or software components configured to perform and execute the processes, steps, or other functionality described in conjunction therewith.

Multi-level quantum system 104 may include, for example, a nuclear spin system, an electron spin system, or superconducting circuit operating as a quantum computer. Multi-level quantum system 104 can include one or more weakly anharmonic qubits (and, in some embodiments, at least three qubits). Examples of weakly anharmonic qubits include the transmon (or "Xmon"), the gatemon, and the capacitively shunted flux qubit. In some embodiments, one or more of the qubits (e.g., a flux-tunable transmon qubit) may be operated as a multi-level noise sensor. Non-limiting examples of superconducting circuitry that can be provided within multi-level quantum system 104 is shown and described in the context of FIGS. 3A and 3B.

Multi-level quantum system 104 can interact with one or more noise sources 130a, 130b, . . . 130n (130 generally), which can result in decoherence in the multi-level system 104. Noise sources 130 can include, for example, one or more of flux noise, charge noise, and photon shot noise. Noise sources 130 can include environmental noise. The types of noise that are present in a given environment may depend on the hardware makeup of the multi-level system. Likewise, the distinguishable noise sources may vary depending upon the multi-level system hardware. In general, the present disclosure can be used to distinguish and identify any type of noise so long as it is coupled to level transitions of the multi-level system with different relative coupling strength.

Noise identification processor 106 may be coupled to quantum system 104 and configured to measure the response of multi-level system 104 to the control signals 120. That is, processor 106 may receive readout signals 122 from multi-level system 104 and, based on the readout signals 122, measure a set of observables associated with multi-level system 104. Processor 106 can extract information about the noise spectra and sources 130 from the measured values of the observables by reconstructing noise spectra at each level of the multi-level system 104. Knowledge of the noise spectra enables identifying dominant noise sources affecting the multi-level system. Noise identification processor 106 can include a collection of hardware and/or software components configured to perform and execute the processes, steps, or other functionality described in conjunction therewith.

In some embodiments, multi-level system 104 (which serves as a noise probe) may be initialized (or "prepared") in a known state. The multi-level system 104 may be allowed to evolve under conditions imposed by both environmental noise 130 and control signals 120 (e.g., pulse sequences or continuous drive signals). A detailed description of these steps, according to some embodiments, is provided below in the context of FIGS. 2B and 2C. These steps can be taken prior to measuring a set of observables of the qubits that quantifies their response to noise sources 130 and the applied control 120.

Having identified noise contribution, processor 106 can provide, as output 124, information regarding the identified noise source(s). The noise spectra and identification information 124 can be used to improve coherence and gate performance within the multi-level quantum system 104. In particular, information about noise sources 130 can be provided as an output 124 and used in an offline manner to improve the design and engineering of the multi-level system 105. For example, the extracted noise spectra and noise source information can be used to increase a shunt capacitance of a superconducting qubit to make it insensitive to charge noise. As another example, extracted noise spectra and noise source information can be used to add more microwave filters along the control lines to reduce photon shot noise. These and other hardware modifications can result in a qubit system with better coherence.

Described next are multi-level quantum systems (or "sensors") and a spin-locking-type QNS protocol that can used to identify noise sources in such systems/sensors. Embodiments of the QNS protocol described herein can be implemented within, for example, noise identification system 100 of FIG. 1. More particularly, portions of the protocol may be implemented within signal generator 102 and/or noise identification processor 106 of FIG. 1.

Figure 2A:
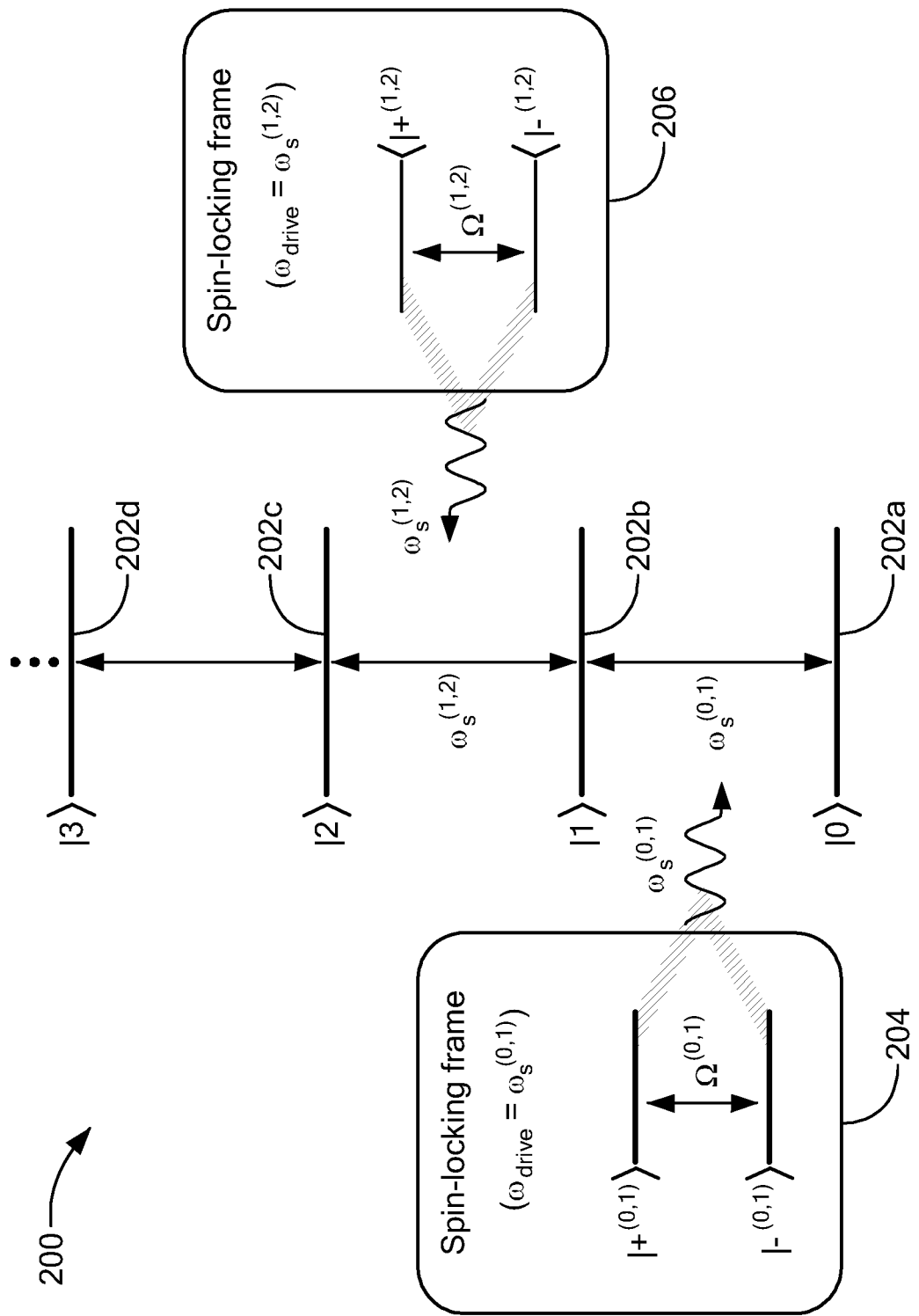
FIG. 2A is a diagram illustrating level transitions in a multi-level quantum system, according to disclosed embodiments.

Referring to FIG. 2A, consider an externally-driven M-level quantum system 200 (M>2), which serves as the quantum noise sensor that evolves under the influence of its noisy environment (bath). That is, system 200 has levels 202a, 202b, 202c, 202d, etc. For simplicity, only pure dephasing ($\sigma_z$-type) noise may be considered in the following discussion. In the interaction picture with respect to the bath Hamiltonian $H_B$, the joint sensor-environment system can be described by the Hamiltonian:

$$H(t) = \hbar \sum_{j=1}^{M-1} [(\omega_s^{(j)} + B^{(j)}(t))|j\rangle\langle j| + \xi(t)\lambda^{(j-1,j)}(\sigma_+^{(j-1,j)} + \sigma_-^{(j-1,j)})], \quad (1)$$

where $|j\rangle\langle j|$ is the projector for the j-th level of the multi-level sensor. The sensor eigen energies are $\hbar\omega_s^{(j)}$ with the ground state energy set to zero, and the $B^{(j)}(t)$ correspond to the time-dependent noise operators that longitudinally couple to the j-th level of the sensor and cause level j to fluctuate in energy. The raising and lowering operators of the sensor are denoted by $\sigma_+^{(j-1,j)} \equiv |j\rangle\langle j-1|$ and $\sigma_-^{(j-1,j)} \equiv |j-1\rangle\langle j|$, respectively. The external driving field is denoted by $\xi(t)$. In some embodiments, the multi-level sensor may be continuously driven with a signal $\xi(t) = A_{drive} \cos(\omega_{drive} t + \phi)$, where $A_{drive}$, $\omega_{drive}$, and $\phi$ correspond to the amplitude, the frequency and the phase of the driving field, respectively, and $\phi = 0$ may be assumed without loss of generality. The parameter $\lambda^{(j-1,j)}$ represents the strength of the $|j-1\rangle - |j\rangle$ transition relative to the $|0\rangle - |1\rangle$ transition with $\lambda^{(0,1)} \equiv 1$.

When the drive frequency $\omega_{drive}$ is resonant with the $|0\rangle - |1\rangle$ transition frequency $\omega_s^{(0,1)}$ of the sensor, the first two levels 202a, 202b form a pair of dressed states, $|+^{(0,1)}\rangle$ and $|-^{(0,1)}\rangle$. The level separation between dressed states is the Rabi frequency $\Omega^{(0,1)}$ as illustrated within box 204, and it is determined predominantly (although not necessarily exactly, as describe below) by the effective driving strength $\lambda^{(0,1)} A_{drive} \equiv A_{drive}$. These dressed states form the usual spin-locking basis $\{|+^{(0,1)}\rangle, |-^{(0,1)}\rangle\}$ of a conventional, driven two-level sensor.

As illustrated in FIG. 2A, the two-level spin-locking concept can be generalized to the case of a multi-level sensor 200. By resonantly driving at the frequency $\omega_s^{(j-1,j)} \equiv \omega_s^{(j)} - \omega_s^{(j-1)}$ of the transition between states $|j-1\rangle$ and $|j\rangle$, the system forms a pair of dressed states, $|+^{(j-1,j)}\rangle$ and $|-^{(j-1,j)}\rangle$, separated by a Rabi frequency $\Omega^{(j-1,j)}$ that is determined predominantly by an effective driving strength $\lambda^{(j-1,j)} A_{drive}$. For example, box 206 illustrates Rabi frequency $\Omega^{(1,2)}$ corresponding to the level separation between dressed states formed by the second and third levels 202b, 202c. The effective two-level system formed by the basis $\{|+^{(j-1,j)}\rangle, |-^{(j-1,j)}\rangle\}$ acts as the j-th spectrometer and probes dephasing noise that leads to a fluctuation of the $|j-1\rangle - |j\rangle$ transition at frequency $\Omega^{(j-1,j)}$. The case j=1 then corresponds back to the conventional two-level noise sensor.

In the present disclosure, the reference frame and two-dimensional subspace defined by the j-th spin-locking basis $\{|+^{(j-1,j)}\rangle, |-^{(j-1,j)}\rangle\}$ are referred to as the j-th "spin-locking frame" and the j-th "spin-locking subspace," respectively. To move to the j-th spin-locking frame, unitary transformations can be applied, and the Hilbert space of the multi-level sensor can be truncated into the j-th spin-locking subspace. Then, the effective Hamiltonian describing the j-th noise spectrometer is:

$$\tilde{H}_{SL}^{(j-1,j)}(t) = \frac{\hbar}{2}[\Omega^{(j-1,j)} + \tilde{B}_\parallel^{(j-1,j)}(t)]\tilde{\sigma}_z^{(j-1,j)} + \hbar\tilde{B}_\perp^{(j-1,j)}(t)(\tilde{\sigma}_+^{(j-1,j)} + \tilde{\sigma}_-^{(j-1,j)}), \quad (2)$$

where $\tilde{\sigma}_z^{(j-1,j)}$, $\tilde{\sigma}_+^{(j-1,j)}$, and $\tilde{\sigma}_-^{(j-1,j)}$ denote the Pauli Z operator, the raising operator, and the lowering operator of the j-th spin-locked spectrometer, respectively. The operators $\tilde{B}_\perp^{(j-1,j)}(t)$ and $\tilde{B}_\parallel^{(j-1,j)}(t)$ denote the noise operators that lead to longitudinal and transverse relaxation of the spectrometer within the j-th spin locking subspace, respectively. They are given as linear combinations of $B^{(j)}(t)$, arising from the level dressing across multiple levels as follows:

$$\tilde{B}_\perp^{(j-1,j)}(t) = \sum_{k=1}^{M-1} \alpha_{(j-1,j)}^{(k)} B^{(k)}(t), \quad (3)$$

$$\tilde{B}_\parallel^{(j-1,j)}(t) = \sum_{k=1}^{M-1} \beta_{(j-1,j)}^{(k)} B^{(k)}(t), \quad (4)$$

where the so-called "noise participation ratio" $\alpha_{(j-1,j)}^{(k)}$ ($\beta_{(j-1,j)}^{(k)}$) is defined as a dimensionless factor that quantifies the fraction of the dephasing noise at the k-th level that is transduced (i.e., projected) to transverse (longitudinal) noise of the j-th pair of spin-locked states. The noise) participation ratios $\alpha_{(j-1,j)}^{(k)}$ and $(\beta_{(j-1,j)}^{(k)}$ can be estimated by numerically solving for the dressed states in terms of the bare states $|j\rangle$. Note that the sign of the noise participation ratios can be either positive or negative, leading to the possibility for effective constructive and destructive interference between the noise operators $B^{(k)}(t)$.

There are two noteworthy distinctions between a manifestly two-level system and a multi-level system. First, although the splitting energy $\hbar\Omega^{(j-1,j)}$ between the j-th pair of dressed states (the j-th spin-locked states) is predominantly determined by the effective driving energy $\hbar(\lambda^{(j-1,j)} A_{drive})$, they are not universally equivalent. For an ideal two-level system within the rotating wave approximation, the Rabi frequency is indeed proportional to the effective driving field via the standard Rabi formula. However, this is not generally the case in a multi-level setting due to additional level repulsion from adjacent dressed states. Rather, in the multi-level setting of relevance here, the distinction between $\Omega^{(j-1,j)}$ and $\lambda^{(j-1,j)} A_{drive}$ must be taken into account to yield an accurate estimation of the noise spectrum.

Second, as a consequence of the multi-level dressing, more than two noise operators $B^{(k)}(t)$ generally contribute to the longitudinal relaxation within a given pair of spin-locked states. In the limit $\lambda^{(j-1,j)} A_{drive}$ is small compared to the sensor anharmonicities, the Eqs. (3)-(4) reduce to $$\tilde{B}_\perp^{(j-1,j)}(t) \approx \frac{1}{2}[B^{(j-1)}(t) - B^{(j)}(t)], \tilde{B}_\parallel^{(j-1,j)}(t) \approx 0, \quad (5)$$

which conform to the standard spin-locking noise spectroscopy protocol for a two-level sensor. However, as the effective drive strength $\lambda^{(j-1,j)} A_{drive}$ increases, the contribution of peripheral bare states—other than $|j-1\rangle$ and $|j\rangle$—to the formation of the spin-locked states $|+^{(j-1,j)}\rangle$ and $|-^{(j-1,j)}\rangle$ increases. As a result, in the large $\lambda^{(j-1,j)} \Omega_{drive}$ limit, the multilevel dressing transduces the frequency fluctuations of more than two levels to the longitudinal relaxation within the j-th spin locking frame. Also, this multi-level effect contributes to the emergence of non-zero transverse relaxation $B_\perp^{(j-1,j)}(t)$, terms which would otherwise be absent within a two-level approximation.

Figure 2B:
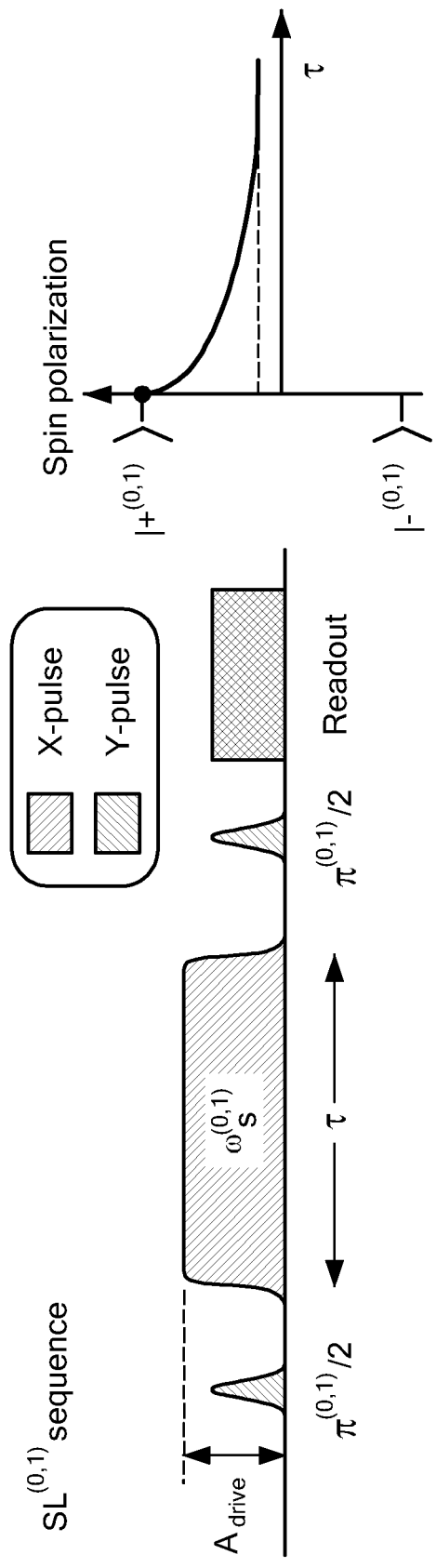
FIGS. 2B and 2C are graphical diagrams showing examples of spin-locking sequences that can be used to measure the relaxation of spin polarization in a multi-level quantum system, according to disclosed embodiments.
Figure 2C:
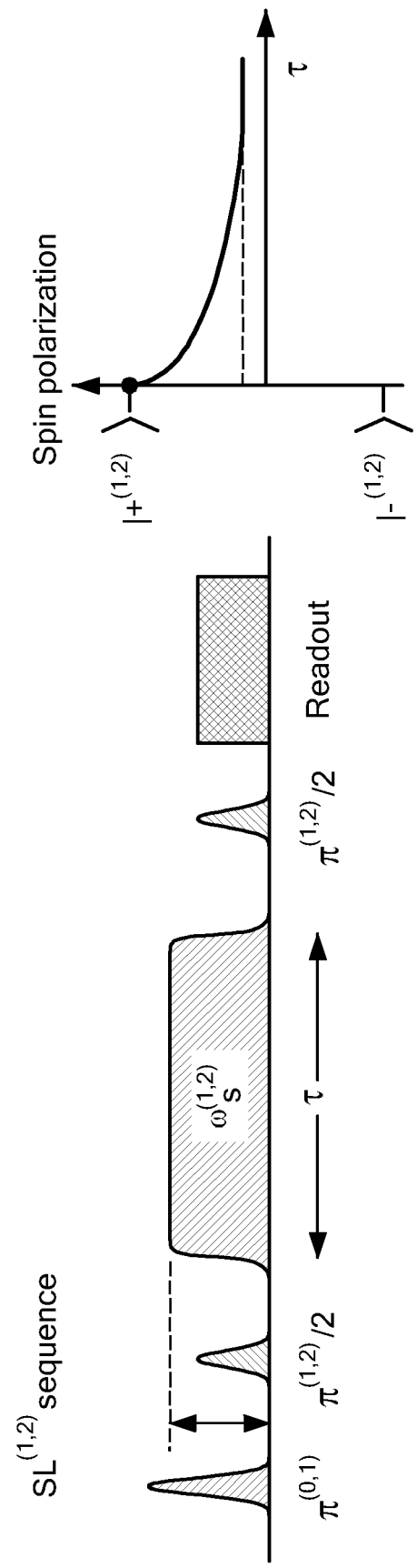

Turning to FIGS. 2B and 2C, a multi-level noise spectroscopy protocol can include measuring the energy decay rate $\Gamma_{1\rho}^{(j-1,j)}$ (i.e., longitudinal relaxation rate) and the polarization $\langle \tilde{\sigma}_z^{(j-1,j)}(\tau)\rangle$ in the j-th spin-locking frame, and then using these quantities to extract the spectral density $\tilde{S}_\perp^{(j-1,j)}$ of the noise transverse to the spin-locking quantization axis. This in turn can be related to the longitudinal spectral density $S_\parallel^{(j-1,j)}$ that cases dephasing (i.e., transverse relaxation) in the original, undriven reference frame (the qubit "lab frame").

The protocol can include preparing the multi-level sensor in the j-th spin-locked state $|+^{(j-1,j)}\rangle$ by applying a sequence of resonant π pulses $[\pi^{(0,1)}, \pi^{(1,2)}, \ldots \pi^{(j-2,j-1)}]$, which act to sequentially excite the sensor from the ground state $|0\rangle$ to state $|j-1\rangle$. Then, a $\pi^{(j-1,j)}/2$ pulse can be applied along the y-axis of the Bloch sphere, where the north and south poles now correspond to $|j-1\rangle$ and $|j\rangle$, respectively. The pulse acts to rotate the Bloch vector from the south pole to the x-axis, thereby placing the multi-level sensor in the j-th spin-locked state $|+^{(j-1,j)}\rangle = (|j-1\rangle+|j\rangle)/\sqrt{2}$. Subsequently, a spin-locking drive with amplitude $A_{drive}$ can be applied along the x-axis (collinear with the Bloch vector) at a frequency resonant with the $|j-1\rangle - |j\rangle$ transition and for a duration $\tau$. For example, referring to FIGS. 2B and 2C, a $\pi^{(0,1)}/2$ pulse and a $\pi^{(1,2)}/2$ pulse can be used to measure the relaxation of spin polarization $|+^{(0,1)}\rangle$ and $|+^{(1,2)}\rangle$ as a function of the spin-locking duration $\tau$, respectively. Then, the spin-locking drive with amplitude $A_{drive}$ can be applied along the x-axis at frequencies $\omega_s^{(0,1)}$ and $\omega_s^{(1,2)}$ resonant with the $|0\rangle-|1\rangle$ and $|1\rangle-|2\rangle$ transitions, respectively.

By adiabatically turning on and off the drive, the state of the sensor can be kept within the j-th spin-locking subspace. Once the drive is off, a second $\pi^{(j-1,j)}/2$ pulse is applied along the y-axis in order to map the spin-locking basis $\{|+^{(j-1,j)}\rangle, |-^{(j-1,j)}\rangle\}$ onto the measurement basis $\{|j\rangle, |j-1\rangle\}$, and the qubit is then read out. This procedure can be repeated N times to obtain estimates for the probability of being in states $\{|j\rangle$ and $|j-1\rangle\}$, which represent the probability of being in states $\{|+^{(j-1,j)}\rangle$ and $|-^{(j-1,j)}\rangle\}$, respectively.

The above protocol can be repeated as a function of $\tau$ in order to measure the longitudinal spin-relaxation decay-function of the j-th spin-locked spectrometer. For each $\tau$, a normalized polarization of the spectrometer can be defined, $$\langle \tilde{\sigma}_z^{(j-1,j)}(\tau) \rangle \equiv \frac{\rho^{(j-1,j-1)}(\tau) - \rho^{(j,j)}(\tau)}{\rho^{(j-1,j-1)}(\tau) + \rho^{(j,j)}(\tau)}, \qquad (6)$$

where $\rho^{(j,j)}(\tau)$ denotes the population (the probability) of the j-th level. From the $\tau$-dependence of $\langle \tilde{\sigma}_z^{(j-1,j)}(\tau) \rangle$, both the relaxation rate $\Gamma_{1\rho}^{(j-1,j)}$ of the spin polarization and the equilibrium polarization $\tilde{\sigma}_z^{(j-1,j)}(\tau)|_{\tau\to\infty}$ can be extracted. The values $\Gamma_{1\rho}^{(j-1,j)}$ and $\tilde{\sigma}_z^{(j-1,j)}(\tau)|_{\tau\to\infty}$ extracted from an experiment performed at a particular Rabi frequency $\Omega^{(j-1,j)}$ are related to the transverse noise PSD $\tilde{S}_\perp^{(j-1,j)}(\omega)$ at angular frequency $\omega = \Omega^{(j-1,j)}$ as follows:

$$\Gamma_{1\rho}^{(j-1,j)} = \tilde{S}_\perp^{(j-1,j)}(\omega) + \tilde{S}_\perp^{(j-1,j)}(-\omega), \qquad (7)$$

$$\langle \tilde{\sigma}_z^{(j-1,j)}(t) \rangle|_{t\to\infty} = \frac{\tilde{S}_\perp^{(j-1,j)}(\omega) - \tilde{S}_\perp^{(j-1,j)}(-\omega)}{\tilde{S}_\perp^{(j-1,j)}(\omega) + \tilde{S}_\perp^{(j-1,j)}(-\omega)}. \qquad (8)$$

Here, the transverse noise spectrum $\tilde{S}_\perp^{(j-1,j)}(\omega)$ is the Fourier transform of the two-time correlation function of the transverse noise operators acting on the spectrometer:

$$\tilde{S}_\perp^{(j-1,j)}(\omega) = \int_{-\infty}^\infty d\tau e^{-i\omega\tau} \langle \tilde{B}_\perp^{(j-1,j)}(\tau) \tilde{B}_\perp^{(j-1,j)}(0) \rangle. \qquad (9)$$

In some embodiments, when performing noise spectroscopy measurements, the spin relaxation for the 1'st and 2'nd spin-locked noise spectrometers can be recorded. Then, the traces may be fit to an exponential decay, allowing for extraction of $\Gamma_{1\rho}^{(j-1,j)}$ and $\rangle\tilde{\sigma}_z^{(j-1,j)}(t)\rangle|_{t\to\infty}$. This may be repeated for various drive amplitude $A_{drive}$ in order to reconstruct $\tilde{S}_\perp^{(j-1,j)}(\omega)$.

Figure 3:
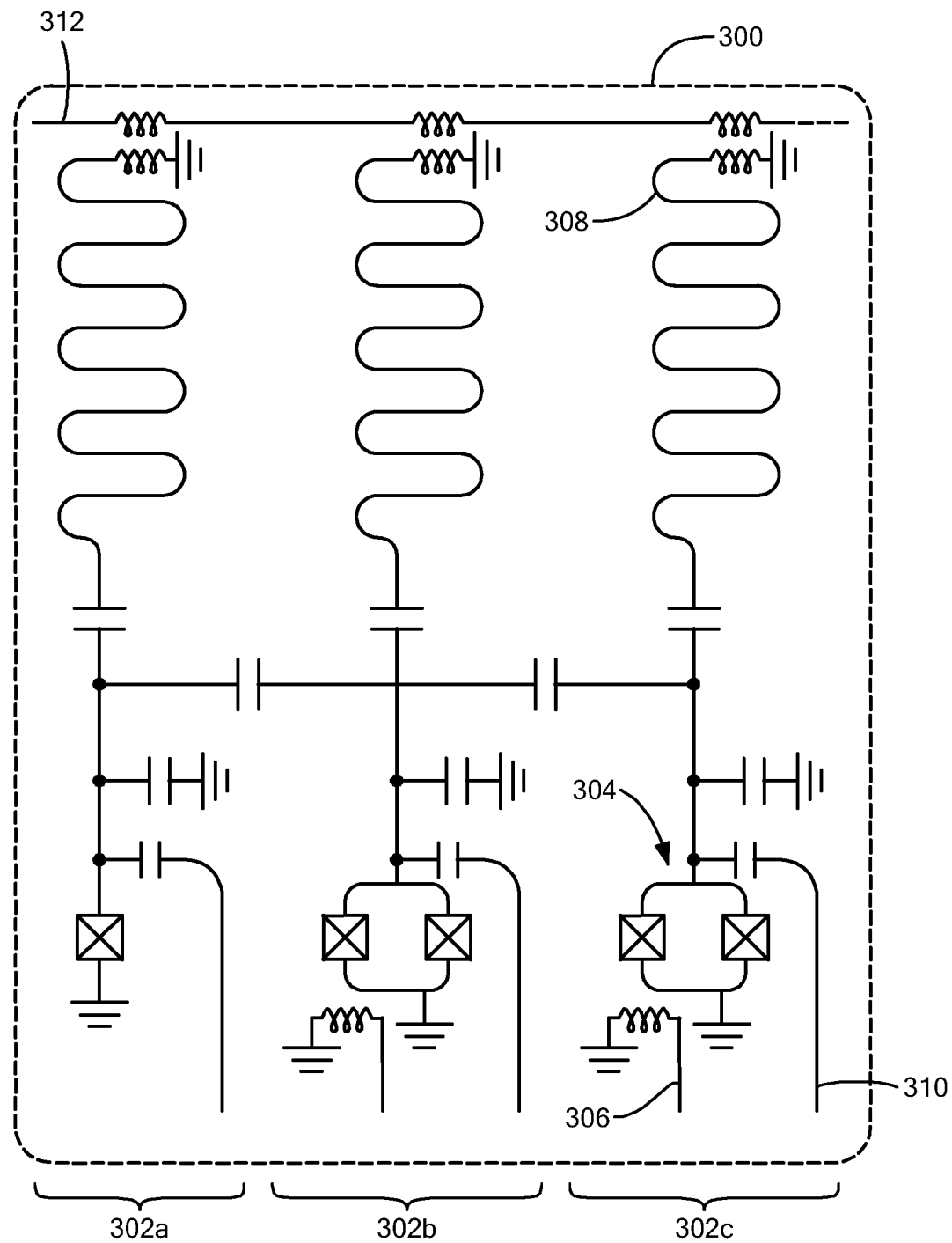
FIG. 3 is a circuit diagram of an illustrative superconducting circuit that may form part of a multi-level quantum system, according to disclosed embodiments.

Turning to FIG. 3, a superconducting circuit 300 may form part of a multi-level quantum system, such as multi-level system 104 of FIG. 1, according to some embodiments. The illustrative circuit 300 includes a plurality of qubits 302a, 302b, 302c (302 generally). While the example of FIG. 3 includes three qubits-first qubit 302a, second qubit 302b, and third qubit 302c-greater numbers of qubits can be provided in other embodiments. In some embodiments, qubits 302 may be provided as transmon qubits.

One of the qubits 302 may be used to measure environmental noise, whereas the other qubits may be used for quantum computing or other purpose. In the example shown, third qubit 302c may include a flux-tunable transmon sensor 304 to measure flux noise and photon shot noise. For experimental purposes, circuit 300 can include independent channels 306 and 308 that can be used to apply flux noise and photon shot noise, respectively, to the superconducting circuit 300. That is, known, engineered flux noise and photon-shot noise can be applied to the third qubit 302a via channels 306, 308. In practice, such noise sources may be environmental, as shown in described above in the context of FIG. 1.

The noise-measuring transmon 304 can be controlled via a capacitively coupled control line 310. The control line 310 may be coupled to receive control signals from a signal generator, such as signal generator 102 of FIG. 1. The additional qubits 302a and 302b may be strongly frequency-detuned from the transmon sensor 304.

The circuit 300 can include a readout line 312 inductively coupled to channel 308, also referred to as readout resonator 308. The readout resonator 308 is capacitively coupled to the qubits 302 such that its resonant frequency is shifted depending on the quantum state of the qubits (this frequency shift is sometimes referred to as "dispersive shift"). A path comprising readout line 312 and readout resonator 308 enables read out of the quantum states of the qubits 302. The readout line 312 can be coupled to a noise identification processor, such as processor 106 of FIG. 1. That is, readout line 312 can provide readout signals used by the noise identification processor to measure a set of observables associated with superconducting circuit 300 and, in turn, to identify dominant noise sources. Together, the control line 310 and readout line 312, and readout resonator 308 can be used to perform noise spectroscopy protocol and measure the results using embodiments of the multi-level QNS protocol disclosed herein.

Control line 310 may be omitted in some embodiments, and transmon 304 may be controlled via a path including readout line 312 and readout resonator 308, or via flux line 306.

In an experimental setting, known, engineered photon-shot noise may also be applied to readout line 312, which is inductively coupled to the readout resonator 308 as shown in FIG. 3.

In some embodiments, the disclosed multi-level QNS protocol can be used for accurate spectral reconstruction of engineered flux noise over a frequency range 50 MHz to 300 MHz, overcoming the spectral limitations imposed by a sensor's relatively weak anharmonicity (e.g., of approximately 200 MHz). Furthermore, by measuring the power spectra of dephasing noise acting on both the $|0\rangle-|1\rangle$ and $|1\rangle-|2\rangle$ transitions, noise contributions from both flux noise and photon shot noise can be extracted and uniquely identified, an attribution that is not possible within solely a two-level approximation.

Figure 4:
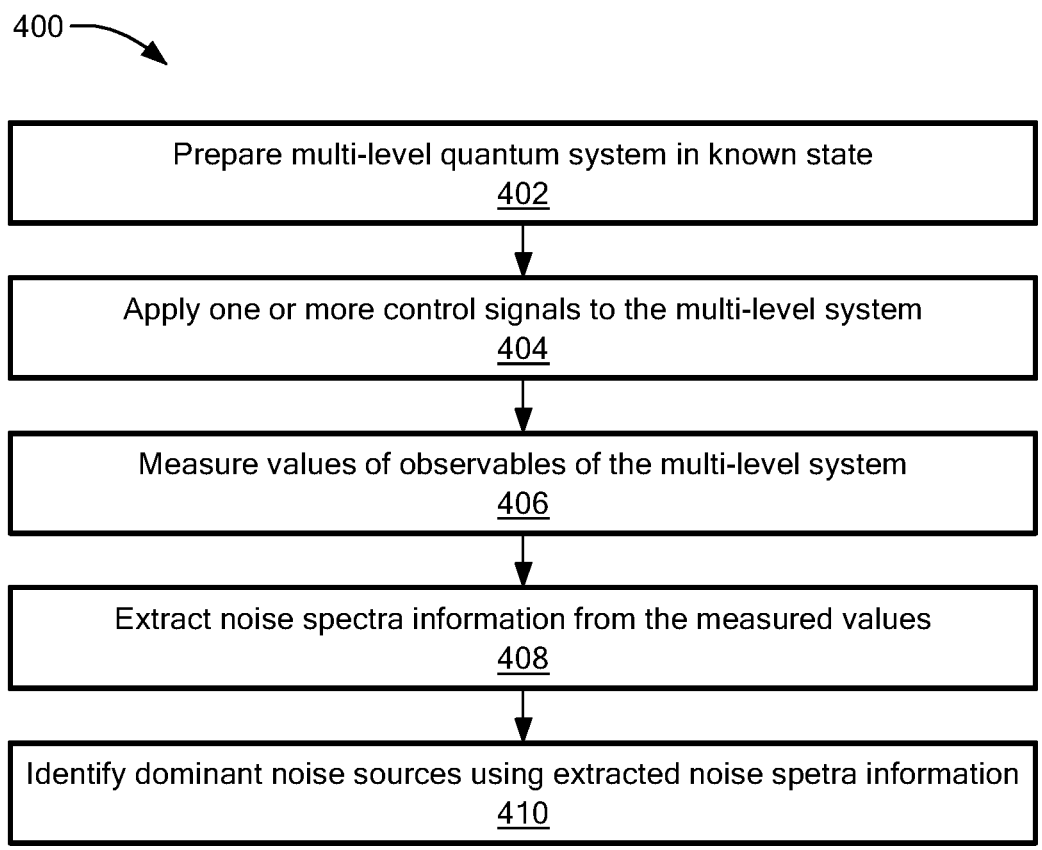
FIG. 4 is a flow diagram of a process for identifying noise sources in multi-level quantum systems, according to disclosed embodiments.

FIG. 4 is a flow diagram of a process 400 for identifying noise contributions from various noise sources in a multi-level quantum system, according to disclosed embodiments.

The illustrative process (or "protocol") can be implemented and/or used within noise identification system 100 of FIG. 1.

At block 402, the multi-level system, which serves as a noise probe, may be prepared in known state using, for example, techniques described above in the context of FIGS. 2B and 2C.

At block 404, one or more controls signals may be applied the multi-level system. The control signals may be generated by a signal generator, such as signal generator 102 of FIG. 1. The probe can be allowed to evolve under both environmental noise and the control signals. Here, the control signals can be either pulse sequences or continuous drive signals. Examples of control signal waveforms that may be used are shown and described in the context of FIGS. 2B and 2C.

At block 406, the response of multi-level system may be determined by measuring a set of observables of the qubits within the multi-level system. The measured observable values may quantify the qubits' response to the environmental noise and the applied control.

At block 408, information about the noise spectra and sources may be extracted from the measured values of the observables. In more detail, noise spectra at each level of the multi-level system may be reconstructed from the measured values.

At block 410, one or more dominant noise sources may be identified using the extracted noise spectra information. Knowledge of the noise spectra and the dominant noise sources can then be used to improve coherence and gate performance within the multi-level quantum system using one of or more of the improvement techniques described above in the context of FIG. 1.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or another unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of nonvolatile memory, including by ways of example semiconductor memory devices, such as EPROM, EEPROM, flash memory device, or magnetic disks. The processor and the memory can be supplemented by, or incorporated in, special purpose logic circuitry.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A method for identifying and discriminating contributions from one or more noise sources using the multi-level structure of a quantum system with three or more levels, the method comprising:
   preparing the quantum system in a predetermined state;
   applying one or more control signals to the quantum system;
   measuring values of one or more observables of the quantum system that quantify the quantum system's response to the noise sources and the one or more applied control signals;
   extracting noise spectra information associated with the noise sources from the measured values; and
   identifying contributions from the one or more noise sources based on the noise spectra information.

2. The method of claim 1, comprising:
   improving performance of the quantum system based on the extracted noise spectra information and the identified contributions from the one or more noise sources.

3. The method of claim 1, wherein the quantum system comprises a plurality of superconducting qubits.

4. The method of claim 3, wherein the superconducting qubits include transmon or gatemon qubits.

5. The method of claim 1, wherein the quantum system comprises at least one of:
   a nuclear spin system,
   an electron spin system,
   a trapped-ion system,
   a neutral-atom system, or
   a superconducting circuit.

6. The method of claim 1, wherein the one or more noise sources include at least two of:
   flux noise,
   charge noise, and
   photon shot noise.

7. A system for identifying and discriminating contributions from one or more noise sources using the multi-level structure of a quantum system with three or more levels, the system comprising:
   a signal generator configured to:
      prepare the quantum system in a predetermined state, and
      apply one or more control signals to the quantum system; and
   a noise identification processor configured to:
      measure values of one or more observables of the quantum system that quantify the quantum system's response to the noise sources and the one or more applied control signals;
      extract noise spectra information associated with the noise sources from the measured values; and
      identify contributions from the one or more noise sources based on the noise spectra information.

8. The system of claim 7, wherein the quantum system comprises a plurality of superconducting qubits.

9. The system of claim 8, wherein the superconducting qubits include transmon or gatemon qubits.

10. The system of claim 7, wherein the quantum system comprises at least one of:
    a nuclear spin system,
    an electron spin system,
    a trapped-ion system,
    a neutral-atom system, or
    a superconducting circuit.

11. The system of claim 7, wherein the one or more noise sources include at least two of:
    flux noise,
    charge noise, and
    photon shot noise.

* * * * *